United States Patent
Cheng et al.

(10) Patent No.: US 7,122,458 B2
(45) Date of Patent: Oct. 17, 2006

(54) METHOD FOR FABRICATING PAD REDISTRIBUTION LAYER

(75) Inventors: Chia-Jen Cheng, Taoyuan (TW); Hui-Mei Yu, Hsinchu Hsien (TW); Li-Hsin Tseng, Taichung (TW); Tzu-Han Lin, Hsinchu (TW); Ching-Chiang Wu, Taichung Hsien (TW); Chun-Yen Lo, Taichung (TW); Li-Chuan Huang, Taipei (TW); Boe Su, Chiayi (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 278 days.

(21) Appl. No.: 10/896,831

(22) Filed: Jul. 22, 2004

(65) Prior Publication Data
US 2006/0019480 A1     Jan. 26, 2006

(51) Int. Cl.
*H01L 21/44* (2006.01)
(52) U.S. Cl. ............... 438/612; 438/613; 438/618; 438/688; 257/E21.508
(58) Field of Classification Search ............. 438/612, 438/613, 618, 688
See application file for complete search history.

(56) References Cited

U.S. PATENT DOCUMENTS

| | | | |
|---|---|---|---|
| 6,362,087 B1 * | 3/2002 | Wang et al. | 438/597 |
| 6,511,901 B1 | 1/2003 | Lam et al. | 438/612 |
| 6,590,295 B1 * | 7/2003 | Liao et al. | 257/781 |
| 6,756,671 B1 * | 6/2004 | Lee et al. | 257/737 |
| 2003/0134496 A1 * | 7/2003 | Lee et al. | 438/612 |

* cited by examiner

*Primary Examiner*—Asok K. Sarkar
*Assistant Examiner*—Victor V. Yevsikov
(74) *Attorney, Agent, or Firm*—Thomas, Kayden, Horstemeyer & Risley

(57) ABSTRACT

A method for fabricating a pad redistribution layer. First, at least one bonding pad exposed by a first passivation layer is provided. A diffusion barrier layer and a seed layer are then formed over the first passivation layer and the bonding pad. A patterned mask layer is then formed over the seed layer to expose a portion thereof over the bonding pad, and a metal layer is then formed thereon. A sacrificial layer is then formed over the substrate and the sacrificial layer over the patterned mask layer is removed. The conductive film exposed by the metal layer and the remaining sacrificial layer is then removed, leaving a pad redistribution layer for the bonding pad.

17 Claims, 3 Drawing Sheets

METHOD FOR FABRICATING PAD REDISTRIBUTION LAYER

BACKGROUND

The present invention relates to semiconductor fabrication, and in particular to a method for fabricating a pad redistribution layer.

In the fabrication of IC devices, semiconductor chips are frequently attached to other chips or other electronic structures such as a printed circuit board. Attachment of the chip can be accomplished by a wire bonding process or by a flip-chip method. In a wire bonding process, each of a series of I/O bump terminals on a chip built on an aluminum bond pad is sequentially bonded to the connecting pads on a substrate. In a flip-chip attachment method, all the I/O bumps on a semiconductor chip terminate with solder material. In the bonding process, a semiconductor chip is flipped over with the solder bumps aligned and placed in a reflow furnace to effect all the I/O connections to bonding pads on a substrate.

A major processing advantage made possible by flip chip bonding is its applicability to very high density I/O connections and high reliability of interconnects formed, compared to wire bonding. Moreover, wire bonding also presents limitations in the total number of I/O interconnections that can be made in high performance devices.

A limiting factor of flip-chip bonding is the fine pitch of bonding pads that are frequently required with modern high density devices. For instance, in a high density memory device, bonding pads arranged along the periphery of the device may have a pitch, or spacing, as small as 100 µm, making it is difficult and costly to bond to the pads using solder bumps in flip chip bonding, since solder bumps in this case are low profile, making underfill extremely difficult. Moreover, a costly high density substrate is required for flip-chip bonding of devices with fine pitch I/O.

In order to bond high density IC devices having fine pitch peripheral I/O bonding pads, in the range of approximately 100 µm, I/O redistribution must first be carried out before the formation of the solder bumps. In the process, peripheral I/O bonding pads are redistributed by signal traces to area array I/O bonding pads to increase pitch in the area array I/O bonding pads. The I/O redistribution process used in modern high density IC devices is therefore an important fabrication step, to form traces between the varied pairs of bonding pads.

In U.S. Pat. No. 6,511,901, Lam et al. disclose a metal redistribution layer having solderable pads and wire bondable pads, and fabrication thereof. Massive etching is needed to pattern a trimetal layer and form openings therein, forming the metal redistribution layer with increased manufacturing difficulty while forming a copper-comprising redistribution layer. Reliability and topography thereof may thus be affected.

SUMMARY

An object of the invention is to provide a redistributed metallization process to form a pad redistribution layer for redistribution of bonding pads.

According to the object described, the present invention provides a method for fabricating a pad redistribution layer, comprising the steps of providing a substrate having at least one bonding pad exposed by a first passivation layer formed thereon and conformably forming a diffusion barrier layer and a seed layer over the first passivation layer and the bonding pad. A patterned mask layer is then formed over the seed layer to expose a portion of the seed layer electrically connecting the bonding pad. A metal layer is then formed over the seed layer exposed by the patterned mask layer. A sacrificial layer is then formed over the metal layer and the patterned mask layer. Next, the patterned mask layer and the sacrificial layer thereon are then removed to expose the seed layer thereunder such that the sacrificial layer remains over the metal layer and the seed layer exposed by the metal layer, and the diffusion barrier layer thereunder and the remaining sacrificial layer are removed, leaving a pad redistribution layer for the bonding pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

Figure 1:
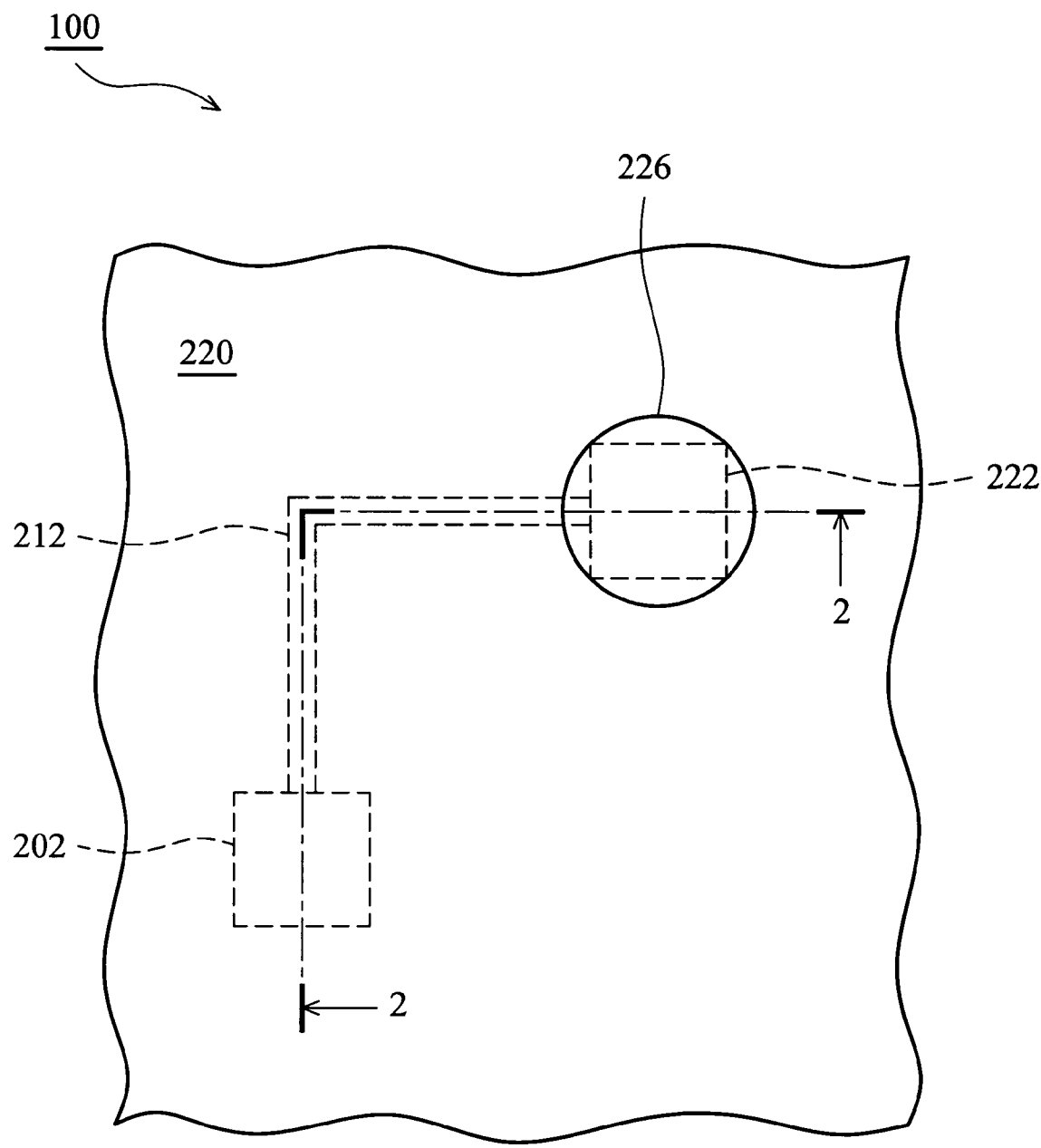
FIG. 1 is a top view of a typical IC device, showing an underlying bonding pad and a pad redistribution layer in accordance with the invention.

FIG. 1 shows an integrated circuit (IC) device 100 in accordance with the invention, including a redistribution metallization structure with a bonding structure at its redistribution layer. The IC device 100 comprises an underlying substrate (not shown) having bonding pads 202 and 222 thereon, shown by dotted lines, covered by a passivaiton layer 220. A redistribution line 212, or trace, electrically contacts both the bonding pads 202 and 222. A conductive bonding such as a solder ball 226 is disposed along with the redistribution line 212, thus effectively redistributing bonding pads and the bonding structure over the IC device 100 to provide higher pinout counts. Greater I/O pin package density is achieved by arranging the bonding structure in the redistribution layer.

FIGS. 2a–2d show the fabrication steps of a redistribution metallization process in accordance with the present invention. These figures are taken from line 2—2 of the FIG. 1 and show how the redistribution metallization is formed.

Figure 2A:
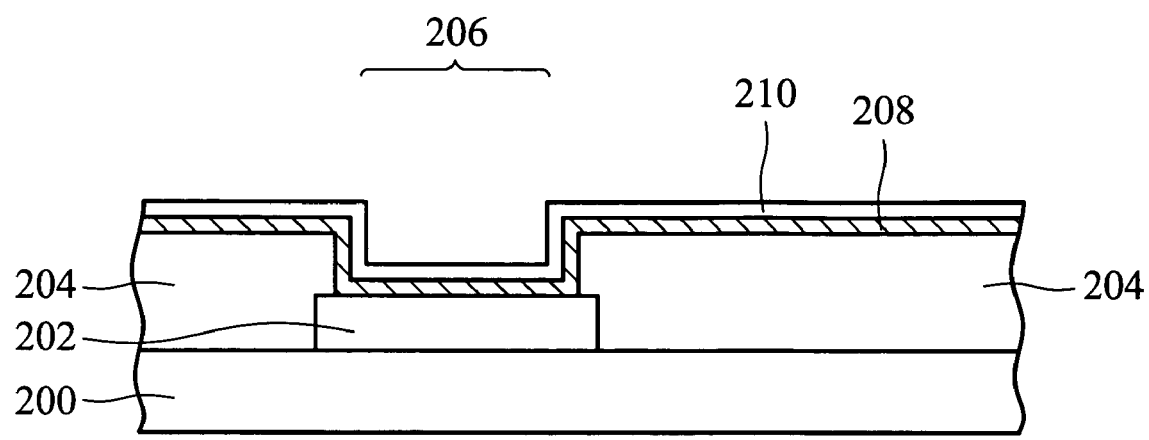
FIGS. 2a–2d show the fabrication steps along the line 2—2 of FIG. 1.

In FIG. 2a, an essentially finished semiconductor substrate 200 with a bonding pad 202 thereon, for input or output connection, is provided. The bonding pad 202 is protected by a first passivation layer 204 of an insulating material and an opening 206 is formed in the first passivation layer 204 to partially expose the bonding pad 202 for subsequent connection in an IC package. It is understood that the semiconductor substrate 200 includes the necessary constituent substrate layer and its associated metal and insulating layers to fully define the circuitry for intended functionality.

Next, a diffusion barrier layer 208 and a metal seed layer 210 are conformably formed over the first passivation layer 204 and the opening 210, covering the exposed portion of the bonding pad 202. Thicknesses of the diffusion barrier layer 208 and the metal seed layer 210 are 100 Å~3000 Å and 500 Å~8000 Å, respectively. The diffusion barrier layer 208 and the metal seed layer 210 can be formed by physical vapor deposition (PVD) such as sputtering. The diffusion layer 208 can be titanium (Ti), titanium nitride (TiN), chromium (Cr), or combinations thereof. The metal seed layer 210 can be, for example, copper metal.

Figure 2B:
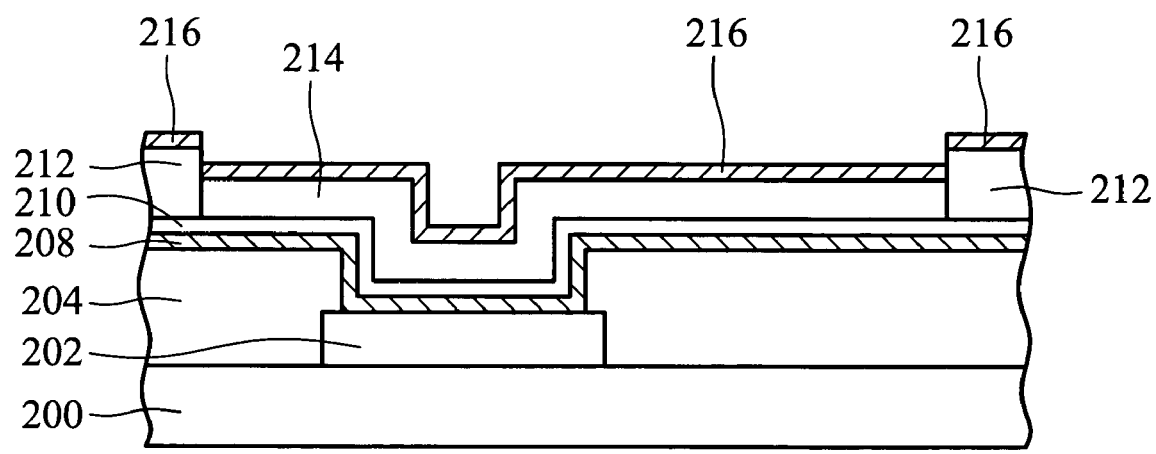

In FIG. 2b, a patterned mask layer 212 for forming a pad distribution layer is then formed over the metal seed layer 210 by known photolithography and etching of a blanket mask layer (not shown) formed thereon. Portions of the blanket mask layer are removed to expose the portion of the metal seed layer 210 electrically connecting the underlying bonding pad 202 and the adjacent portions thereof. The mask layer can be, for example, photoresist material. Next, a conformal metal layer 214 with a thickness of 0.5~10 μm is selectively formed over the metal seed layer 210 exposed by the patterned mask layer 212 through fabricating techniques known in the art. Preferably, plating, such as electrochemical plating (ECP) or electroless plating, is performed when the metal layer 214 is a copper layer for better electrical performance. Next, a sacrificial layer 216 with a thickness of about 100 Å~300 Å is formed over the semiconductor substrate 200 to cover top surfaces of the patterned mask layer 212 and the metal layer 214. As a key feature of the invention, the sacrificial layer 216 is the same as that of the diffusion barrier layer 208 and the material thereof can be, for example, titanium (Ti), titanium nitride (TiN), chromium (Cr), or combinations thereof.

Figure 2C:
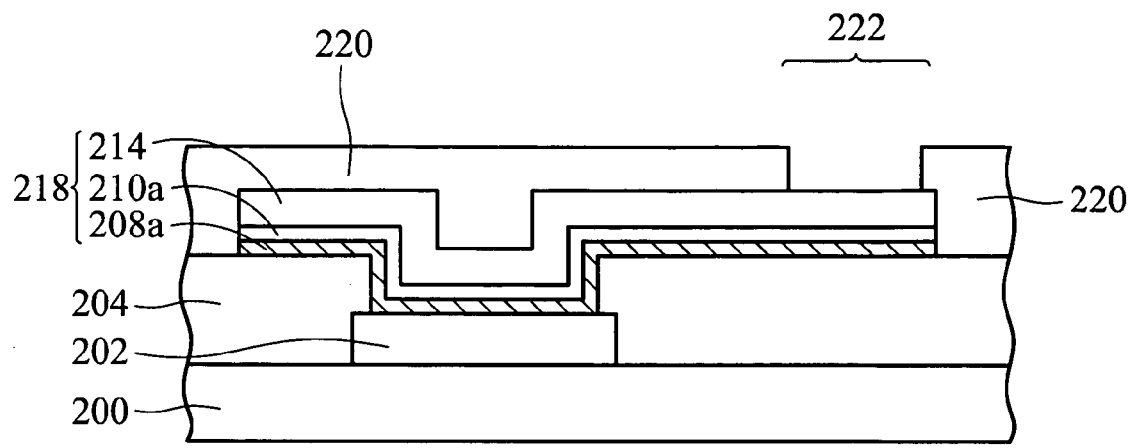

In FIG. 2c, the patterned mask layer 212 is then removed by method such as wet etching, thus achieving the goal of simultaneous removal of the portion of the sacrificial layer 216 thereon without additional treatment thereto, exposing conductive film such as the metal seed layer 210 and the diffusion barrier layer 208 under the patterned mask layer 212. Next, etching, such as wet etching, is performed on the exposed film, leaving the metal layer 214, the patterned diffusion barrier layer 208a and the patterned metal seed layer 210a over the substrate 200 as a pad redistribution layer 218 for the underlying bonding pad 202. The exposed portion of the metal seed layer 210 can be first removed, and the underlying diffusion barrier layer thereof and the portion of the sacrificial layer 216 remaining on the metal layer 214 can then be simultaneously removed by wet etching using multiple chemical baths relative to each material thereof. In the etching, the remaining sacrificial layer functions as an etching barrier for the metal layer 214 against the chemical baths of the wet etching, with only a minor sidewall portion thereof not covered by the remaining sacrificial layer slightly etched without affecting the topography of the metal layer 214

Next, a second passivation layer 220 is blanketly formed over the semiconductor substrate 200 to cover the pad redistribution layer 218 and the first passivation layer 204. The second passivation layer 220 can be, for example, photosensitive polyimide and the second passivaiton layer 220 is then patterned to form a second opening 222 therein by, for example, photolithography, thus exposing a portion of the pad redistribution layer 218 as a site for subsequent IC packaging.

Figure 2D:
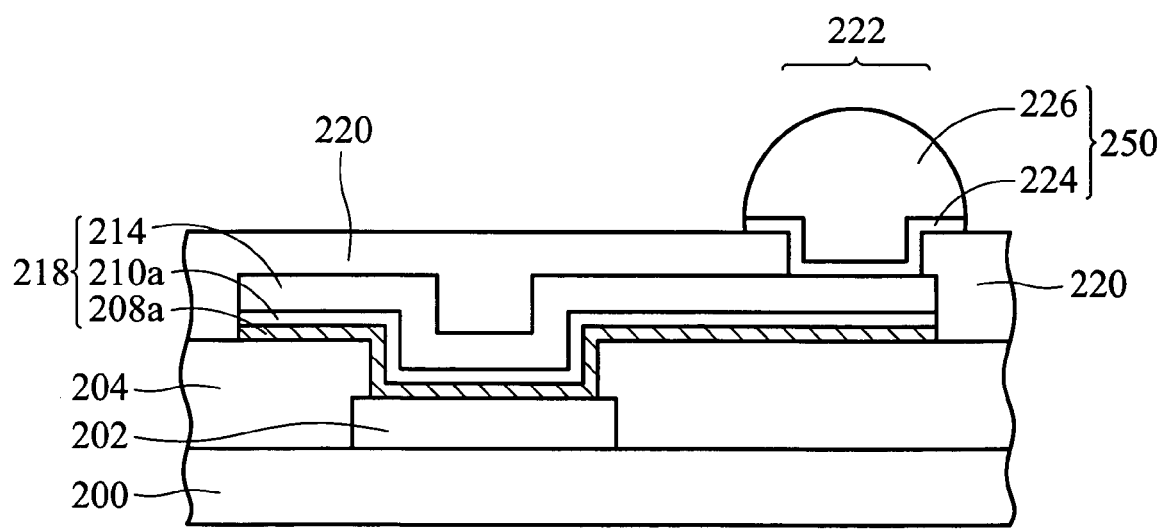

In FIG. 2d, conductive bonding 250 is then formed on the second opening 222, electrically connecting the underlying bonding pad 202 by the metal redistribution layer 218. The conductive bonding 250 illustrated in FIG. 2d is a conductive bonding 250 including a solder ball 226 and an underlying under-bump-metallurgy (UBM) layer 224 conformably formed in the seconding opening 222. The conductive bonding 250 can use other bonding technique, such as conductive wire or wire bonding, and is not restricted to the solder ball 226 illustrated in FIG. 2d.

As one advantage of the metallization process of the invention, the metal seed layer and the underlying diffusion barrier layer for forming the pad distribution layer are first masked to leave a pattern of the pad distribution layer, and the metal layer is then selectively formed over the exposed metal seed layer with the existing patterned mask. A massive etching for patterning pad distribution layer of a great thickness of metal material is thus prevented and no additional CMP process is needed for planarization of the pad distribution layer. Moreover, in one embodiment of the invention, the pad distribution layer is a copper pad distribution layer to provide better electrical performance between the upper conductive bonding and the underlying bonding pad thereof. The copper pad distribution layer is selectively formed by plating such as ECP plating or electroless plating.

As another advantage of the metallization process of the invention, a sacrificial layer of the same material as the diffusion barrier layer formed over the pad redistribution layer provides etching resist during removal of the patterned mask and the underlying films, thus protecting the pad redistribution layer, providing the substrate with high reliability and better topography for electrical connection of the under-layer bonding pad and the upper conductive bonding.

The method for fabricating pad redistribution layer of the invention prevents fabrication difficulty from a possible massive etching to the metal layer when patterning a copper pad distribution layer, as in conventional methods. A pad redistribution layer with better reliability and better topography is thus formed. Thus, a copper redistribution layer for high speed and high performance semiconductor devices such as graphic processor, power amplifier IC devices, or radiofrequency (RF) IC devices is provided in the described fabrication steps. Fabrication costs are reduced and device performance is enhanced by the redistribution of the bonding pads.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a pad redistribution layer, comprising:

providing a substrate having at least one bonding pad exposed by a first passivation layer formed thereon;

conformably forming a diffusion barrier layer and a seed layer over the first passivation layer and the bonding pad;

forming a patterned mask layer over the seed layer to expose a portion of the seed layer electrically connecting the bonding pad;

forming a metal layer over the seed layer exposed by the patterned mask layer;

forming a sacrificial layer over the metal layer and the patterned mask layer;

removing the patterned mask layer and the sacrificial layer thereon to expose the seed layer thereunder such that the sacrificial layer remains over the metal layer; and removing the seed layer exposed by the metal layer, the diffusion barrier layer thereunder and the remaining sacrificial layer to leave a pad redistribution layer.

2. The method as claimed in claim 1, further comprising:
blanketly forming a second passivation layer over the pad redistribution layer;
forming an opening in the second passivation layer to expose a portion of the pad redistribution layer; and
forming a conductive bonding in the opening to electrically connect the bonding pad by the pad redistribution layer.

3. The method as claimed in claim 1, wherein the diffusion barrier layer and the seed layer are sequentially formed over the substrate and the bonding pad.

4. The method as claimed in claim 1, wherein the diffusion barrier layer comprises Ti.

5. The method as claimed in claim 1, wherein the seed layer comprises Cu.

6. The method as claimed in claim 1, wherein the sacrificial layer comprises the same material as the diffusion barrier layer.

7. The method as claimed in claim 6, wherein the sacrificial layer comprises Ti.

8. The method as claimed in claim 1, wherein the the metal layer is formed by electrochemical plating or electroless plating.

9. The method as claimed in claim 1, wherein the sacrificial layer over the patterned mask layer is simultaneously removed during the removal of the pattern mask layer.

10. The method as claimed in claim 1, wherein the conductive bonding is a solder bump.

11. A method for fabricating a copper pad redistribution layer, comprising:
providing a substrate having at least one bonding pad exposed by a first passivation layer formed thereon;
conformably forming a diffusion barrier layer and a copper seed layer over the first passivation and the bonding pad;
forming a patterned mask layer over the copper seed layer to expose a portion of the copper seed layer electrically connecting the bonding pad;
plating a copper layer over the copper seed layer exposed by the patterned mask layer to form a copper layer;
forming an sacrificial layer over the copper layer and the patterned mask layer, wherein the sacrificial layer is the same material as the diffusion barrier layer;
removing the patterned mask layer and the sacrificial layer thereon to expose a portion of the copper seed layer such that the sacrificial layer remains over the copper layer;
simultaneously removing the copper seed layer exposed by the copper layer, the diffusion barrier layer thereunder and the remaining sacrificial layer to leave a copper pad redistribution layer.

12. The method as claimed in claim 11, further comprising the steps of:
blanketly forming a second passivation layer over the copper redistribution layer;
forming an opening in the second passivation layer to expose a portion of the copper redistribution layer; and
forming a conductive bonding in the opening to electrically connect the bonding pad by the copper pad redistribution layer.

13. The method as claimed in claim 12, wherein the conductive bonding is a solder bump.

14. The method as claimed in claim 11, wherein the diffusion barrier layer comprises Ti.

15. The method as claimed in claim 11, wherein the copper layer is plated by electrochemical plating or electroless plating.

16. The method as claimed in claim 11, wherein the sacrificial layer over the patterned mask layer is simultaneously removed during removal of the pattern mask layer.

17. The method as claimed in claim 11, wherein the copper seed layer exposed by the copper layer, the diffusion barrier layer thereunder and the remaining sacrificial layer are simultaneously removed in a wet etching using multiple chemical baths.

* * * * *